(12) United States Patent
Izuha

(10) Patent No.: US 8,028,267 B2
(45) Date of Patent: Sep. 27, 2011

(54) PATTERN DESIGNING METHOD, PATTERN DESIGNING PROGRAM AND PATTERN DESIGNING APPARATUS

(75) Inventor: Kyoko Izuha, Kanagawa (JP)

(73) Assignee: Sony Corporation, Tokyo (JP)

( * ) Notice: Subject to any disclaimer, the term of this patent is extended or adjusted under 35 U.S.C. 154(b) by 571 days.

(21) Appl. No.: 12/124,435

(22) Filed: May 21, 2008

(65) Prior Publication Data

US 2008/0295049 A1  Nov. 27, 2008

(30) Foreign Application Priority Data

May 24, 2007  (JP) ................................. 2007-137541

(51) Int. Cl.
*G06F 17/50* (2006.01)
(52) U.S. Cl. .............. 716/136; 716/51; 716/52; 716/54; 716/55; 716/106; 716/132; 716/139
(58) Field of Classification Search .................... 716/51, 716/52, 54, 55, 132, 136, 139
See application file for complete search history.

(56) References Cited

U.S. PATENT DOCUMENTS

| 5,637,031 A * | 6/1997 | Chen ................................ 451/41 |
| 7,454,300 B2 * | 11/2008 | Suaya et al. ..................... 702/65 |
| 7,685,558 B2 * | 3/2010 | Lai et al. .......................... 716/51 |
| 7,783,999 B2 * | 8/2010 | Ou et al. ......................... 716/136 |
| 2008/0046846 A1 * | 2/2008 | Chew et al. ....................... 716/2 |
| 2008/0168410 A1 * | 7/2008 | Pikus et al. ....................... 716/5 |
| 2008/0216027 A1 * | 9/2008 | White et al. ...................... 716/4 |
| 2009/0031261 A1 * | 1/2009 | Smith et al. ...................... 716/2 |
| 2010/0251191 A1 * | 9/2010 | Suaya et al. ...................... 716/4 |

FOREIGN PATENT DOCUMENTS

| JP | 09-319067 | 12/1997 |
| JP | 2001-230323 | 8/2001 |
| JP | 2005-301618 | 10/2005 |
| JP | 2006-038896 | 2/2006 |
| JP | 2006-209702 | 8/2006 |
| JP | 2005-294852 | 7/2009 |

OTHER PUBLICATIONS

Office Action issued by the Japanese Patent Office on May 26, 2009 in connection to related Japanese Patent Application No. 2007-119964.

* cited by examiner

*Primary Examiner* — Helen Rossoshek
(74) *Attorney, Agent, or Firm* — SNR Denton US LLP

(57) ABSTRACT

An embodiment of the invention provides a pattern designing method, including the steps of carrying out transfer simulation calculation and step simulation calculation by using physical layout data produced from circuit design data, and comparing a result of the transfer simulation calculation and the step simulation calculation with a preset standard; and carrying out calculation for electrical characteristics by using parameters obtained from the physical layout when as a result of the comparison, the preset standard is fulfilled, and carrying out calculation for the electrical characteristics by reflecting the result of the transfer simulation calculation and the step simulation calculation in the parameters when as the result of the comparison, the preset standard is not fulfilled, thereby extracting the parameters.

6 Claims, 8 Drawing Sheets

FIG.3

Tech file library
Metal
H: typical,best,worst
W: typical,best,worst
Layer1
H: typical,best,worst
W: typical,best,worst
Layer2
H: typical,best,worst
W: typical,best,wost
⋮
LayerN
H: typical,best,worst
W:typical,best,worst
R*C
C:typical,best,worst
R:typical,best,worst

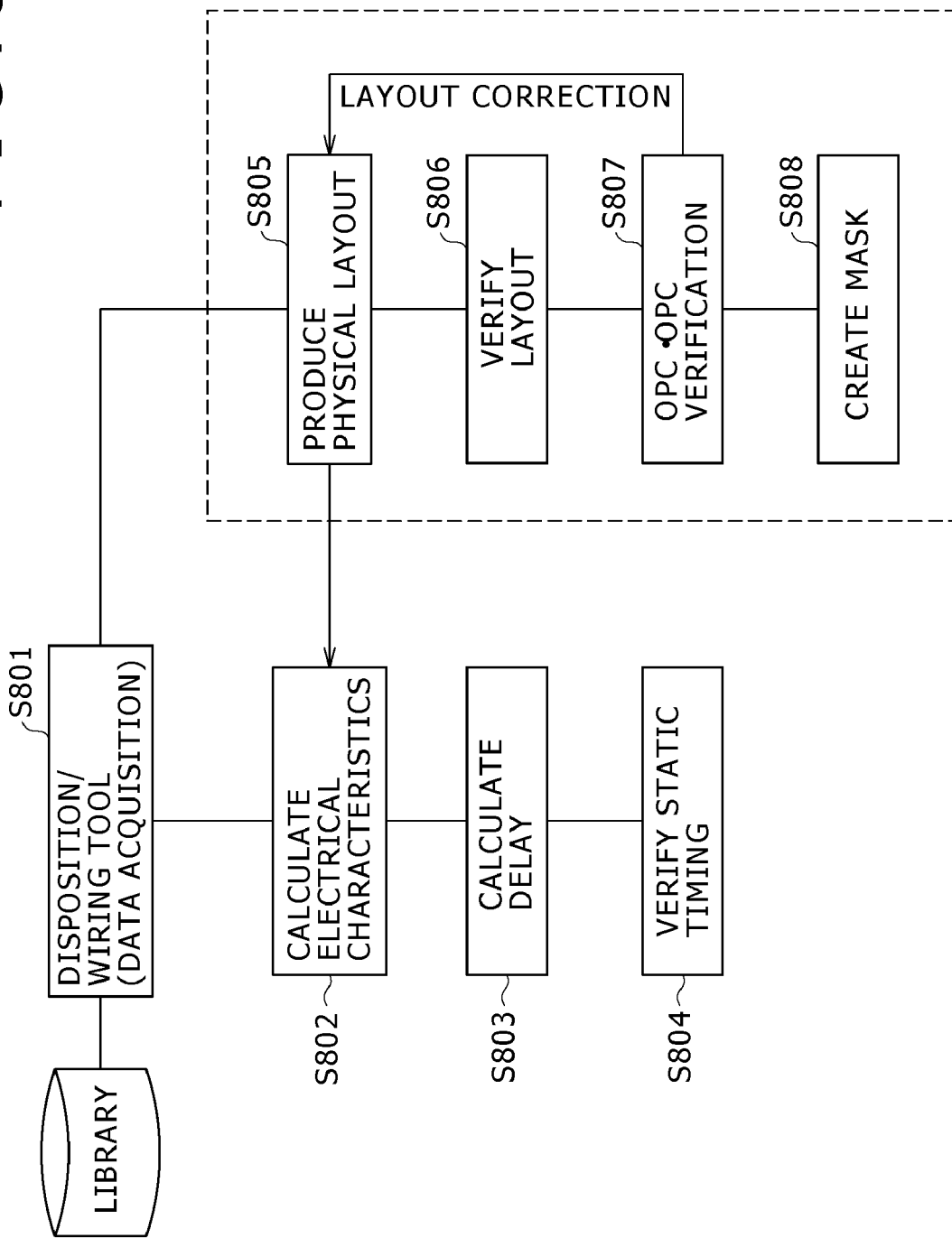

PATTERN DESIGNING METHOD, PATTERN DESIGNING PROGRAM AND PATTERN DESIGNING APPARATUS

CROSS REFERENCES TO RELATED APPLICATIONS

The present invention contains subject matter related to Japanese Patent Application JP 2007-137541 filed in the Japan Patent Office on May 24, 2007, the entire contents of which being incorporated herein by reference.

BACKGROUND OF THE INVENTION

1. Field of the Invention

The present invention relates to a pattern designing method of extracting a resistance value and a capacitance value as electrical characteristics of a semiconductor circuit from design data of a semiconductor integrated circuit, and carrying out a timing verification, a pattern designing program, and a pattern designing apparatus.

2. Description of the Related Art

The progress of the recent semiconductor manufacturing technology is very remarkable, and thus the semiconductor devises each having a minimum process dimension of 0.1 µm or less have been mass-produced. Along with the scale down of such semiconductor devices, there is caused such a problem that the semiconductor devices are not manufactured so as to fulfill the intended performance due to an influence of a process dispersion which did not become a problem in the previous generations.

A layout fidelity and timing convergence directly receive the influence of the process dispersion. In order to solve the problem about the layout fidelity, an optical proximity correction (OPC) technique for previously adding an auxiliary pattern to a design pattern so that a dimension after completion of the fabrication process fulfills a desired pattern, a process proximity correction (PPC) technique (hereinafter referred to as "a PPC technique") or the like is reported as one of the method of enhancing the layout fidelity in Japanese Patent Laid-Open No. Hei 9-319067 referred to as Patent Document 1 hereinafter.

On the other hand, the problem about the timing convergence is described as follows. That is to say, a problem that misfit between design data and a transferred image on a wafer substrate causes an extraction precision to become worse in the stage for extracting the characteristics comes to be of particular note. In such a situation, a problem that a difference in fine shape between a design pattern and a transferred image when the design pattern is transferred onto a wafer substrate exerts a bad influence on the timing convergence owing to a process fluctuation becomes more acute along with the scale down of the semiconductor devices.

At present, in addition to the two problems described above, a thickness dispersion generated in a longitudinal structure (cross-sectional structure) of the device, or the like has to be taken into consideration when the capacitance value is extracted from the design data. That is to say, as apparent from FIG. 7, a consideration about the layout means a consideration about the x-y cross section, and a consideration about the cross-sectional structure means a consideration about the device in an x-z direction. Since there is actually the process fluctuation, a transferred image on a wafer substrate in the layout of an x-y plane has to be taken into consideration. On the other hand, in a cross-sectional structure as well in the x-z direction, a film thickness disperses due to the process fluctuation, thus resulting in a dispersion being contained in each of layers. Therefore, how to take such fluctuations in the x-y and x-z directions in a technology file from which the capacitive value is extracted becomes a point for realizing the high precision.

The following method is known as one of the techniques which have been proposed up to this day for the purpose of promoting the high precision for the capacitance value extraction. That is to say, the pattern is designed in accordance with the design correction rules allowing for the electrical characteristics of the circuit, and the mask data is created for the design data so that the design pattern thus produced fulfills a margin for the process. This method, for example, is described in Japanese Patent Laid-Open No. 2006-038896 referred to as Patent Document 2 hereinafter. The electrical characteristics described above, for example, mean the capacitance value of the circuit. Thus, the design pattern is created so as to fulfill the specification about the predetermined capacitance value. Also, the mask pattern is created so that the image of the design pattern transferred onto the wafer substrate fulfills the process margin associated with the specification fulfilling the electrical characteristics.

In addition, Japanese Patent Laid-Open No. 2001-230323 referred to as Patent Document 3 hereinafter proposes the following technique. That is to say, the data on the difference between the shape on the wafer substrate after completion of the etching and the design pattern is previously prepared for the design pattern by using the test pattern. Also, the correspondence is made for that difference in accordance with the dimension in the layout which is actually processed, thereby creating the circuit pattern in which the finished dimension on the wafer substrate is reflected. Thus, the data on the resulting circuit pattern is then inputted to an extraction tool.

FIG. 8 is a flow chart showing a flow of typical processing in the techniques described above. According to those techniques, the design pattern can be corrected or the mask pattern data can be created so as to fulfill the predetermined capacitance value. As a result, it is possible to avoid the layout which becomes a problem in terms of the electrical characteristics.

In addition thereto, the extraction can be carried out by using the layout after measures have been taken to cope with a portion which became a problem in terms of the characteristics. That is to say, the electrical characteristics are calculated (Step S802) by using the physical layout (Step S805) for which the correction processing has been executed in the flow chart of FIG. 8. Each of the techniques disclosed in Patent Documents 2 and 3 described above is an approach for taking measures to cope with the layout on the X-Y plane of FIG. 7, creating the typical layout on the x-y plane, and carrying out the extraction so as to correspond to the cross-sectional structure about the x-z plane.

SUMMARY OF THE INVENTION

However, with the related art method (Steps S805 to S808 shown in FIG. 8), the various measures are taken to cope with the portion which became the problem in terms of the electrical characteristics. Thus, the layout design is corrected whenever the characteristic specification during the extraction is in transit, which leads to that the processing from Step S805 to Step S808 is repeatedly executed. As a result, a lot of time for the calculation may be required.

In order to solve the problem described above, according to an embodiment of the present invention, there is provided a pattern designing method, including the steps of: carrying out transfer simulation calculation and step simulation calculation by using physical layout data produced from circuit design data, and comparing a result of the transfer simulation calculation and the step simulation calculation with a preset standard; and carrying out calculation for electrical characteristics by using parameters obtained from the physical layout when as a result of the comparison, the preset standard is fulfilled, and carrying out calculation for the electrical characteristics by reflecting the result of the transfer simulation calculation and the step simulation calculation in the parameters when as the result of the comparison, the preset standard is not fulfilled, thereby extracting the parameters.

According to the embodiment of the present invention, when the result of the transfer simulation calculation and the step simulation calculation carried out by using the physical layout data does not fulfill the preset standard, the calculation for the electrical characteristics is carried out by using the parameters in which the result of the transfer simulation calculation and the step simulation calculation is reflected, thereby extracting the parameters. As a result, the estimated dispersion in process can be speedily reflected in the calculation for the electrical characteristics.

According to another embodiment of the present invention, there is provided a pattern designing method, including the steps of: carrying out transfer simulation calculation and step simulation calculation by using physical layout data produced from circuit design data, and comparing a result of the transfer simulation calculation and the step simulation calculation with a preset standard; carrying out calculation for electrical characteristics by using parameters obtained from the physical layout when as a result of the comparison, the preset standard is fulfilled; carrying out calculation for a resistance value and a capacitance value in a physical layout in a cross-sectional direction of coordinates of a portion in which the preset standard is not fulfilled when as a result of the comparison, the preset standard is not fulfilled, carrying out calculation for the electrical characteristics by using parameters obtained from the physical layout when a result of the calculation falls within a preset tolerance, and carrying out calculation for the electrical characteristics when the result of the calculation does not fall within the preset tolerance by reflecting the result of the transfer simulation calculation and the step simulation calculation in the parameters, extracting the parameters.

According to the another embodiment of the present invention, when the result of the transfer simulation calculation and the step simulation calculation carried out by using the physical layout data does not fulfill the preset standard, the resistance value and the capacitance value in the physical layout in the cross-sectional direction of the coordinates of the portion in which the preset standard is not fulfilled are calculated. When the calculation result is beyond the preset tolerance, the calculation for the electrical characteristics is carried out by using the parameters in which the result of the transfer simulation calculation and the step simulation calculation is reflected. As a result, the dispersion in the process in which the resistance value and the capacitance value are estimated to be beyond the tolerance can be speedily reflected in the calculation for the electrical characteristics.

According to still another embodiment of the present invention, there is provided a pattern designing method of extracting a resistance value and a capacitance value of a semiconductor circuit from design data on a semiconductor integrated circuit to carry out a timing verification, the pattern designing method including the steps of: carrying out disposition and wiring for functional cells constituting a physical layout based on design data on the semiconductor integrated circuit; acquiring values of parameters about a line width, a step, a resistance value, a capacitance value, and a product of the resistance value and the capacitance value in the physical layout and set values of dispersions thereabout; carrying out calculation for a line width and a step in a transferred image on a semiconductor substrate in the physical layout; carrying out calculation for electrical characteristics by using parameters obtained from the physical layout when as a result of the calculation, both the line width and the step in the transferred image on the semiconductor substrate are within ranges of the respective dispersions, and comparing a value of the dispersion and a calculated value with each other when one of the line width and the step is beyond a range of corresponding one of the dispersions, thereby judging whether or not it is necessary to correct the physical layout and the step; carrying out the correction when as a result of the judgment, it is necessary to correct the physical layout and the step, and judging whether or not it is necessary to carry out recalculation for a capacitance value for a portion for which one of the line width and the step is beyond the range of the corresponding one of the dispersions when as the result of the judgment, the correction is unnecessary; and carrying out calculation for electrical characteristics by using parameters obtained from the physical layout when the recalculation for the capacitance value is unnecessary, carrying out calculation for a product of the capacitance value and the resistance value after completion of the calculation for the capacitance value when the recalculation for the capacitance value is necessary, and changing parameters for capacitance value extraction when the product is beyond the range of the corresponding one of the dispersions.

According to the still another embodiment of the present invention, when the result of the simulation calculation for the line width and the step in the transferred image using the physical layout data is beyond the range of the preset dispersion, the physical layout about the portion in which the standard is not fulfilled is corrected. When it is necessary to carry out the recalculation for the capacitance value, after completion of the recalculation, the parameters used in the calculation for the electrical characteristics are changed when the calculated value is beyond the range of the dispersion. As a result, the estimated dispersion in the process can be speedily reflected in the calculation for the electrical characteristics.

According to yet another embodiment of the present invention, there is provided a pattern designing method of extracting a resistance value and a capacitance value of a semiconductor circuit from design data on a semiconductor integrated circuit to carry out a timing verification, the pattern designing method including the steps of: previously setting tolerances for values of parameters about a resistance value, a capacitance value, and a product of the resistance value and the capacitance value in the semiconductor circuit, information on a dimension and information on a step after completion of transfer of a pattern of the semiconductor circuit; obtaining information on a dimension after completion of transfer on a semiconductor substrate in a physical layout in which functional blocks constituting the design data are disposed and wired; obtaining information on a step in a cross-sectional direction on the semiconductor substrate in the physical layout; comparing the tolerances, and the information on the dimension and the information on the step after completion of the transfer with each other; carrying out a schematic inspection, a design rule check, a proximity correction, and proximity verification processing when as a result of the comparison, the tolerances are fulfilled; calculating a resistance value and a capacitance value of a portion in a physical layout in a cross-sectional direction in coordinates on the semiconductor substrate in a pattern which does not fulfill the corresponding one of the tolerances by using electromagnetic equations when as a result of the comparison, one of the information on the dimension and the information on the step after completion of the transfer is beyond the corresponding one of the tolerances; comparing again the result of the calculation, and the tolerance with each other, and carrying out calculation for electrical characteristics by using parameters obtained from the physical layout when the result of the calculation is within the range, of the resistance value and the capacitance value, to which a preset dispersion amount is added; registering the information on the dimension and the information on the step after completion of the transfer in a library when one of the information on the dimension and the information on the step after completion of the transfer does not fulfill the corresponding one of the tolerances; obtaining a product of the resistance value and the capacitance value in the physical layout, and comparing the product with the corresponding one of the tolerances; carrying out calculation for the electrical characteristics by using the parameters obtained from the physical layout when the product of the resistance value and the capacitance value fulfills the corresponding one of the tolerances; and changing the parameters obtained from the physical layout when the product of the resistance value and the capacitance value does not fulfill the corresponding one of the tolerances.

According to the yet another embodiment of the present invention, when the result of the simulation calculation for the line width and the step after the completion of the transfer using the physical layout data is beyond the range of the preset dispersion, the information on the dimension and the information on the step after completion of the transfer are registered in the library. In addition, when the product of the resistance value and the capacitance value does not fulfill the corresponding one of the tolerances, the parameters obtained from the physical layout are changed. As a result, the estimated dispersion in the process can be speedily reflected in the calculation for the electrical characteristics.

According to a further embodiment of the present invention, there is provided a pattern designing program, including the steps of: carrying out transfer simulation calculation and step simulation calculation by using physical layout data produced from circuit design data, and comparing a result of the transfer simulation calculation and the step simulation calculation with a preset standard; and carrying out calculation for electrical characteristics by using parameters obtained from the physical layout when as a result of the comparison, the preset standard is fulfilled, and carrying out calculation for the electrical characteristics by reflecting the result of the transfer simulation calculation in the parameters when as the result of the comparison, the preset standard is not fulfilled, thereby extracting the parameters.

According to the further embodiment of the present invention, when the result of the transfer simulation calculation and the step simulation calculation carried out by using the physical layout data does not fulfill the preset standard, the calculation for the electrical characteristics is carried out by using the parameters in which the result of the transfer simulation calculation is reflected. As a result, the estimated dispersion in the process can be speedily reflected in the calculation for the electrical characteristics.

According to en even further embodiment of the present invention, there is provided a pattern designing apparatus, including: means for carrying out transfer simulation calculation and step simulation calculation by using physical layout data produced from circuit design data, and comparing a result of the transfer simulation calculation and the step simulation calculation with a preset standard; and means for carrying out calculation for electrical characteristics by using parameters obtained from the physical layout when as a result of the comparison, the preset standard is fulfilled, and carrying out calculation for the electrical characteristics by reflecting the result of the transfer simulation calculation in the parameters when as the result of the comparison, the preset standard is not fulfilled, thereby extracting the parameters.

According to the even further embodiment of the present invention, when the result of the transfer simulation calculation and the step simulation calculation carried out by using the physical layout data does not fulfill the preset standard, the calculation for the electrical characteristics is carried out by using the parameters in which the result of the transfer simulation calculation is reflected. As a result, the estimated dispersion in the process can be speedily reflected in the calculation for the electrical characteristics.

Consequently, according to an embodiment of the present invention, the timing convergence for the calculation carried out in the phase of the pattern design can be performed for a short period of time. As a result, the layout design fulfilling both the specifications about the transfer simulation and the electrical characteristics can be readily carried out. In addition, the number of man-hour of the design can be reduced. As a result, the number of sheets of masks to be manufactured can be reduced all the more because the number of man-hour of the redoing is removed. Moreover, finally, the enhancement of the yield of the products can be realized and the semiconductor device having a narrower pattern can be manufactured.

BRIEF DESCRIPTION OF THE DRAWINGS

FIG. 3 is an image view of a technology file library;

FIG. 8 is a flow chart explaining a flow of a related art pattern designing method.

DETAILED DESCRIPTION OF THE PREFERRED EMBODIMENTS

Preferred embodiments of the present invention will be described in detail hereinafter with reference to the accompanying drawings.

First Embodiment

Figure 1:
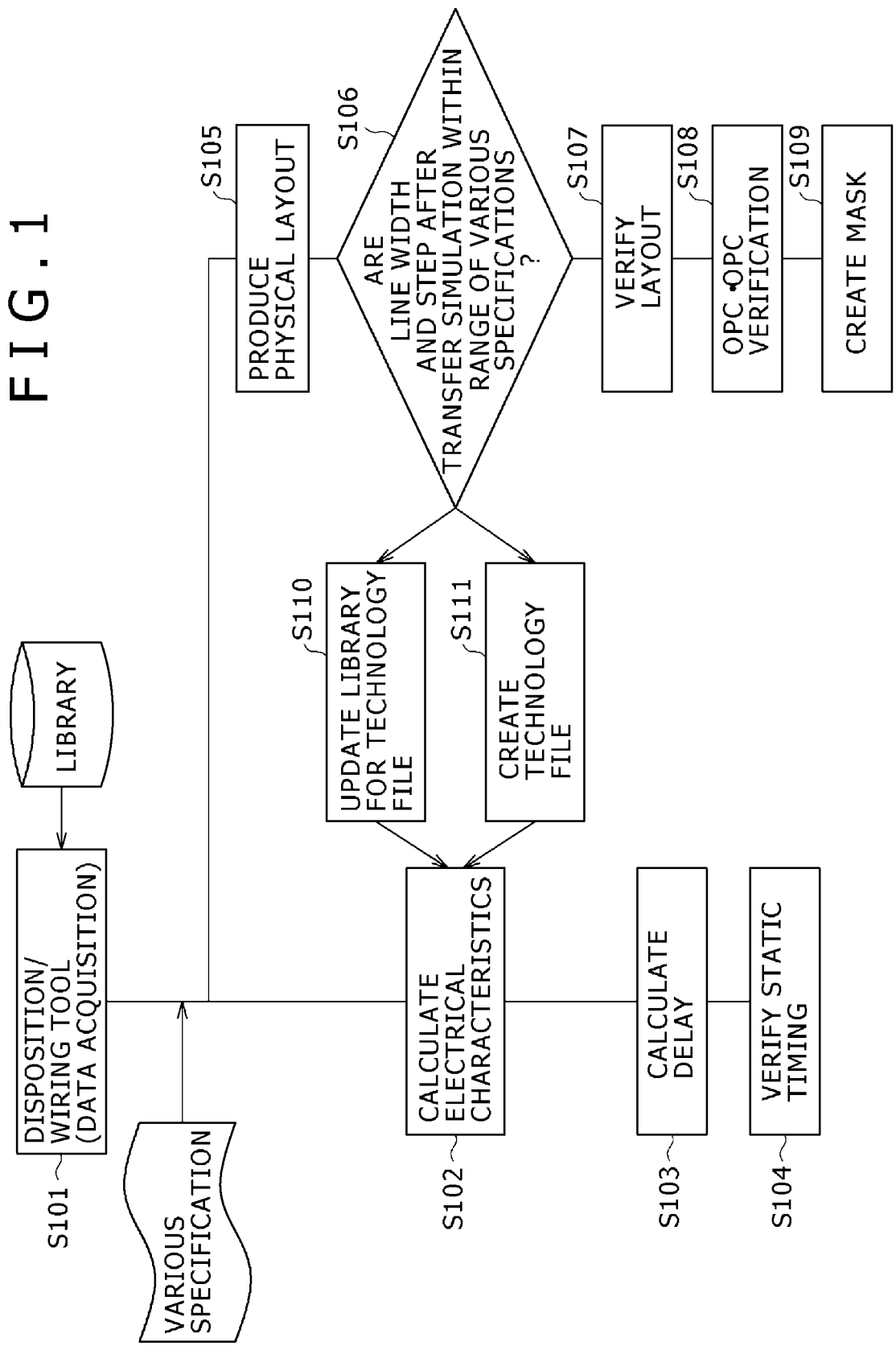
FIG. 1 is a flow chart explaining a flow of a pattern designing method according to a first embodiment of the present invention.

FIG. 1 is a flow chart explaining a flow of a pattern designing method according to a first embodiment of the present invention. In this pattern designing method, processing of Step S106, and Steps S110 and S111 as processing for a shape screening for a layout, and parameter inputting processing necessary for executing the processing described above are added to the same processing of Steps S101 to S104, Step S105, and Steps S107 to S109 as that in the related art pattern designing method shown in FIG. 8.

Figure 2:
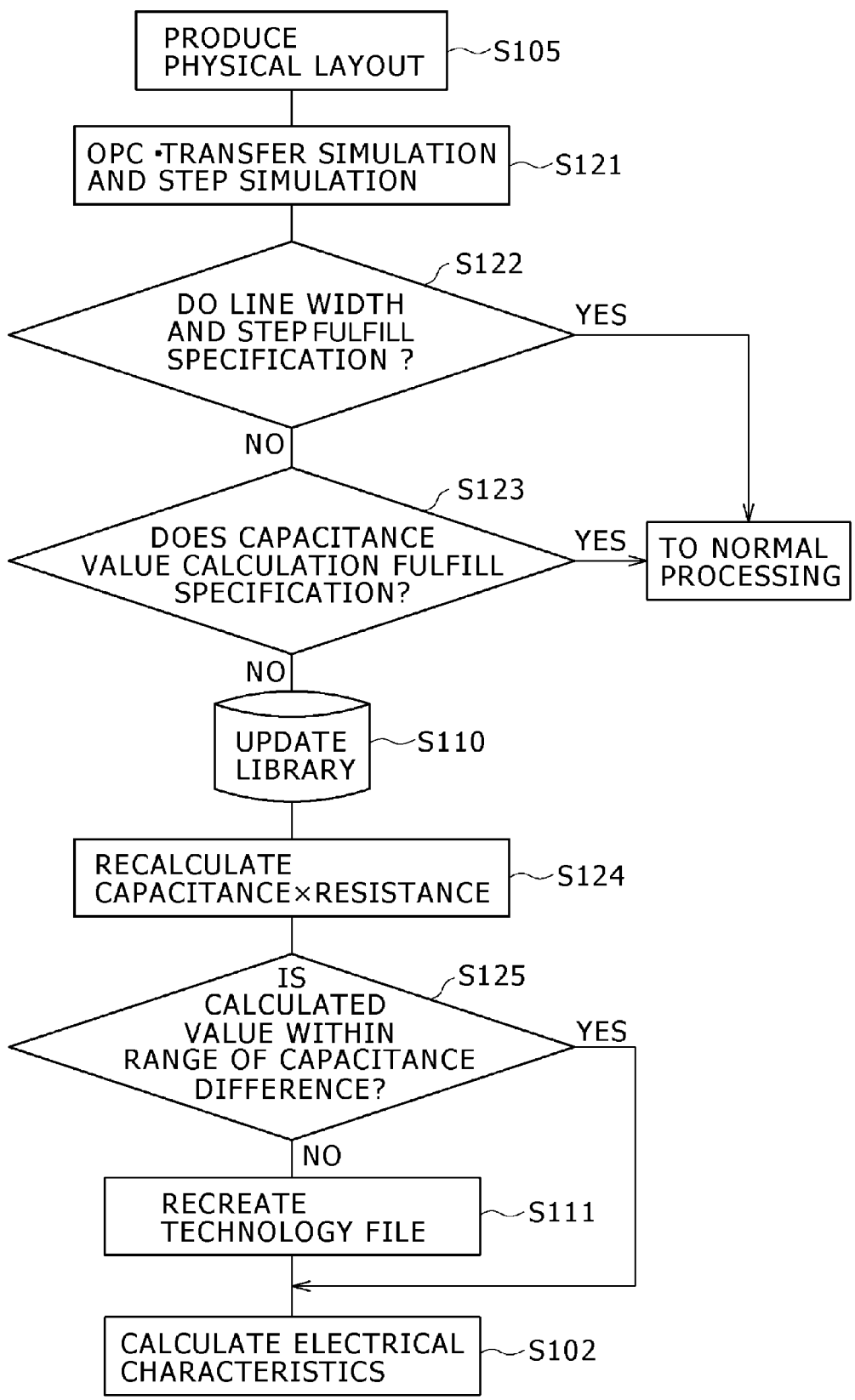
FIG. 2 is a flow chart showing the details of a main processing portion of the pattern designing method according to the first embodiment of the present invention.

In addition, FIG. 2 is a flow chart showing the details of a main processing portion of the pattern designing method according to the first embodiment of the present invention. In FIG. 2, the same Step numbers, as those in FIG. 1, of Step numbers representing the processing shown in FIG. 2 represent the same processing as that in FIG. 1.

Hereinafter, the pattern designing method according to the first embodiment of the present invention will be described in detail with reference to the flow charts of FIGS. 1 and 2. Firstly, design data and the like are acquired from a library by using a disposition/wiring tool (Step S101). For example, a cell library, a disposition/wiring technology file, and circuit connection information are given as the design data.

Next, data on a physical layout is produced by the disposition/wiring tool (Step S105). Also, the shape screening is carried out for the data on the physical layout (Step S106).

In the shape screening, a transfer simulation is carried out by using the data on the physical layout to judge whether or not a line width and a step in a pattern after completion of the simulation calculation fulfill the ranges of various specifications previously inputted.

Here, a device dispersion such as a dispersion in a line width and a film thickness in a pattern, a Typical structure, a deposition disposition in parameters of a metal and interlayer films, a dispersion (difference) in a capacitance value in the Typical structure, specifications about a capacitance value, a resistance value and the product of the capacitance value and the resistance value, and the like are given as the various specifications.

Specifically, mask data for the data on the physical layout is created, and a transfer simulation and a chemical mechanical polishing (CMP) simulation (or a coverage simulation) are carried out for the mask layout thus created.

The details of the shape screening will now be described with reference to the flow chart of FIG. 2. Firstly, an OPC•transfer simulation, and a step (CMP) simulation are carried out (Step S121). Optical conditions for the OPC•transfer simulation set as an example are an exposure wavelength of 193 nm, NA=0.75, σ=0.85, and a ⅔ orbicular zone.

In addition, data on a transferred image is calculated for a plurality of conditions so as to fall within an exposure amount margin. The exposure amount is changed 0.5 mJ step by 0.5 mJ step with 13.5 mJ as a center, and a defocus amount is calculated at steps of 0.05 μm within the range of best focus ±0.2 μm. It is noted that for a set value for a dose-focus condition, a line and space of 100 nm is set as a target. On the other hand, in the step simulation, the CMP processing is previously executed by using a test pattern, and correlation data between the process conditions for the products and a step in the CMP is acquired.

Results, of a line width and a step in a pattern in the physical layout, which are obtained from the simulations are compared with previously inputted values of a dispersion in the line width and a dispersion in the film thickness. Thus, it is judged whether or not the results obtained from the simulations fall within the ranges of the dispersion in the line width and the dispersion in the film thickness (Step S122). When it is judged in Step S122 that the results obtained from the simulations fall within the ranges of the dispersion in the line width and the dispersion in the film thickness (Yes in Step S122), calculation (hereinafter referred to as "normal processing") for electrical characteristics is carried out by using parameters obtained from the physical layout.

Here, a line width of each of layers constituting the physical layout, a thickness of each of interlayer films formed between layers, a permittivity, and amounts of dispersions in the line width of each of the layers constituting the physical layout, the thickness of each of the interlayer films formed between the layers, and the permittivity are given as the parameters obtained from the physical layout used when the calculation (for example, capacitance value extraction) for the electrical characteristics is carried out.

On the other hand, when it is judged in Step S122 that the results obtained from the simulations are beyond the ranges of the dispersion in the line width and the dispersion in the film thickness (No in Step S122), calculation for a capacitance value is carried out by using a cross-sectional structure of a portion in which the results obtained from the simulations are beyond the ranges of the dispersion in the line width and the dispersion in the film thickness (Step S123). At this time, capacitance values of a plurality of portions are calculated so that the circumferential environment is reflected in the capacitance value concerned. Moreover, the capacitance value thus calculated is compared with the specification of the previously inputted capacitance value (Step S123). When it is judged in Step S123 that the capacitance value thus calculated fulfills the specification of the previously inputted capacitance value (Yes in Step S123), the normal processing is executed.

On the other hand, when it is judged in Step S123 that the specification of the previously inputted capacitance value is not fulfilled (No in Step S123), information on a cross-sectional structure of a portion in which the specification of the previously inputted capacitance value is not fulfilled, and information on a shape, a thickness and a height of a metal, and shapes, thicknesses and heights of interlayer films are registered in a technology file library (Step S110). Here, for the specification about the capacitance value, typical one of the cross-sectional structures of the device is previously determined and the capacitance value for the typical cross-sectional structure is previously calculated. Also, ±X % of the capacitance value thus calculated is set as the specification about the capacitance value. Although a value of X differs depending on the generation of the device, the precision necessary for the capacitance value extraction, and the like, it is set as ±10% in this embodiment.

Thus, after the screening is completed, a plurality of cross-sectional structures for each of which the screening is performed by carrying out the shape simulation, and the calculation for the capacitance value is carried out exist in the technology file library.

FIG. 3 shows an image view of the technology file library, for example. All the values about the cross-sectional structures registered are inputted to the technology file library. In this case, average values (typical), maximum values (worst) and minimum values (best) of values of thicknesses and widths of the metal (Metal) and interlayer films (Layer 1, . . . , Layer N), and average values (typical), maximum values (worst) and minimum values (best) of capacitance values and resistance values are registered at the head of the technology file library. In library update (Step S110) in the processing flow of this embodiment, typical, best, and worst in the technology file are updated.

After the contents of the technology file library are updated, all the resistance values are calculated based on the cross-sectional structures, and the product of the capacitance value and the resistance value is calculated (Step S124). It is noted that an order of priority is fixed to the capacitance values based on the results of the calculation for the capacitance values, and in this situation, it is also possible to calculate the products of the capacitance values and the resistance values of the cross-sectional structures in which the maximum value, the minimum value, and the average value are obtained in the capacitance values.

Also, each of the recalculated products of the capacitance values and the resistance values is compared with the specification about the product of the capacitance value and the resistance value. When the recalculated value falls within a variation range, it is registered in the technology file library. On the other hand, when the recalculated value is beyond the variation range, the contents of the technology file for a capacitance value extracting tool are rewritten (Step S111).

Figure 4:
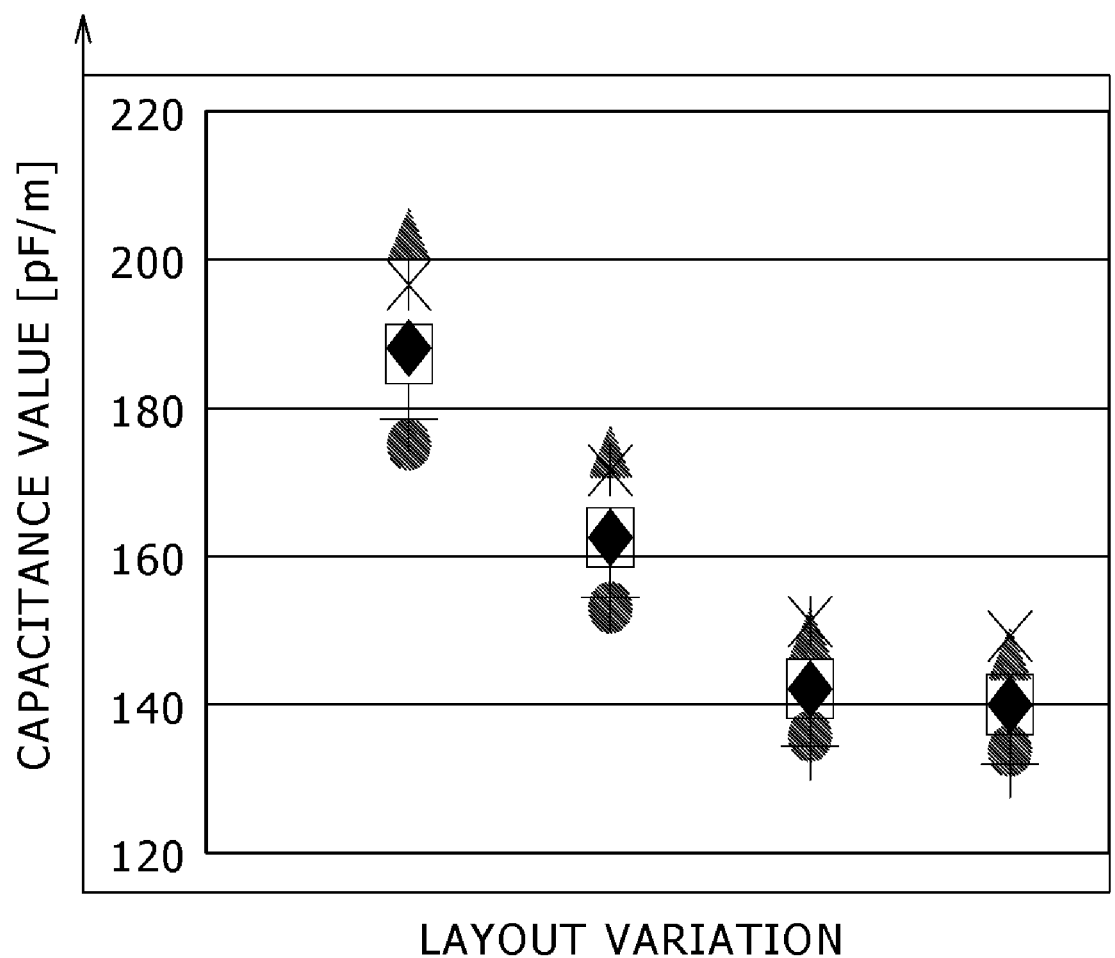
FIG. 4 is graphical representation showing an example of results of calculation for capacitance values in layouts used in the first embodiment of the present invention.

FIG. 4 is a graph showing an example of results of calculation for capacitance values in the layouts used in this embodiment. In the graph of FIG. 4, the axis of abscissa represents a layout variation about the metal line width, and the axis of ordinate represents a capacitance value (pF/m). The graph shows the capacitance values in six kinds of structures which are different in cross-sectional structure (a film thickness or the like in an x-z direction) from one another every layout variation (every layout of an x-y plane).

Of them, the capacitance values indicated by a rectangular mark and a rhombic mark, respectively, was within the range of the specification about the range of the line width variation. Thus, these capacitance values were obtained by executing the normal processing. The capacitance values indicated by a mark + and a mark *, respectively, were obtained through the capacitance value calculation because they did not fulfill the specification about the range of the line width variation. As a result of that calculation, these capacitance values were registered in the library for a technology file because they did not fulfill the specification about the capacitance value.

Moreover, since the capacitance values indicated by a triangular mark and a circular mark, respectively, were judged to be out of the specification from the processing in Steps of S122 to S125 of FIG. 2, the technology file was recreated. Also, the capacitance value is extracted from the technology file in which the longitudinal structures having the capacitance values indicated by the triangular mark and the circular mark, respectively, are reflected.

Each of the maximum values and the minimum values of the capacitance values indicated by the triangular mark and the circular mark, respectively, had a difference of 5% or more with respect to the specification (maximum−minimum) about the previously given capacitance values. When the maximum capacitance values and the minimum capacitance value in the specification were fulfilled, an impact to delay due to the wiring capacitance value was about 7%, and a delay value was +121 ps from the delay calculation carried out by using a test circuit for the products of certain generation.

On the other hand, it was found out from the capacitance value extraction file created in this embodiment that the impact of the wiring capacitance value to the delay is 5%, and the delay value is 96 ps. Using of the technique of this embodiment makes it possible to update a corner of the product of the capacitance value and the resistance value to more realistic one. As a result, it is possible to enhance the precision necessary for the delay calculation.

It is noted that the optical conditions for the transfer simulation used in this embodiment are by no means limited to those described above, and thus can be changed in correspondence to the layout to be processed. In addition, those optical conditions can respond to the various conditions for a period of time from start-up time of the products to maturation time of the process conditions.

Moreover, when the processing of this embodiment is intended to be executed, an order of priority may be fixed to the processing in consideration of the electrical characteristics. That is to say, it is also possible that the transfer simulation is necessarily carried out for a portion corresponding to a critical path of a circuit, and the normal verification processing is executed for any other region other than a region corresponding to that portion.

In addition, if the verification for the line width and the step of the metal can be carried out, a verification using a method different from that for the transfer simulation and the step simulation as in this embodiment may also be carried out. In addition, the feedback of the result of the verification for the line width and the step varies depending on the extraction tools. Therefore, the specification about the technology file in this embodiment, and the technology file library shown in FIG. 3 vary depending on the tools used.

Effects of Embodiment

By using the pattern designing method of this embodiment, the dispersion in the layout of the device, and the dispersion in the cross-sectional structure are fed back to the technology file, thereby making it possible to enhance the precision necessary for the capacitance value extraction. In addition, the enhancement of the precision necessary for the capacitance value extraction results in that the corner of the capacitance value which has been excessively driven in a borderline state up to this day is relaxed, and thus the design margin necessary for the extraction decreases. As a result, it is possible to prevent the design margin from being dissipated.

Second Embodiment

Figure 5:
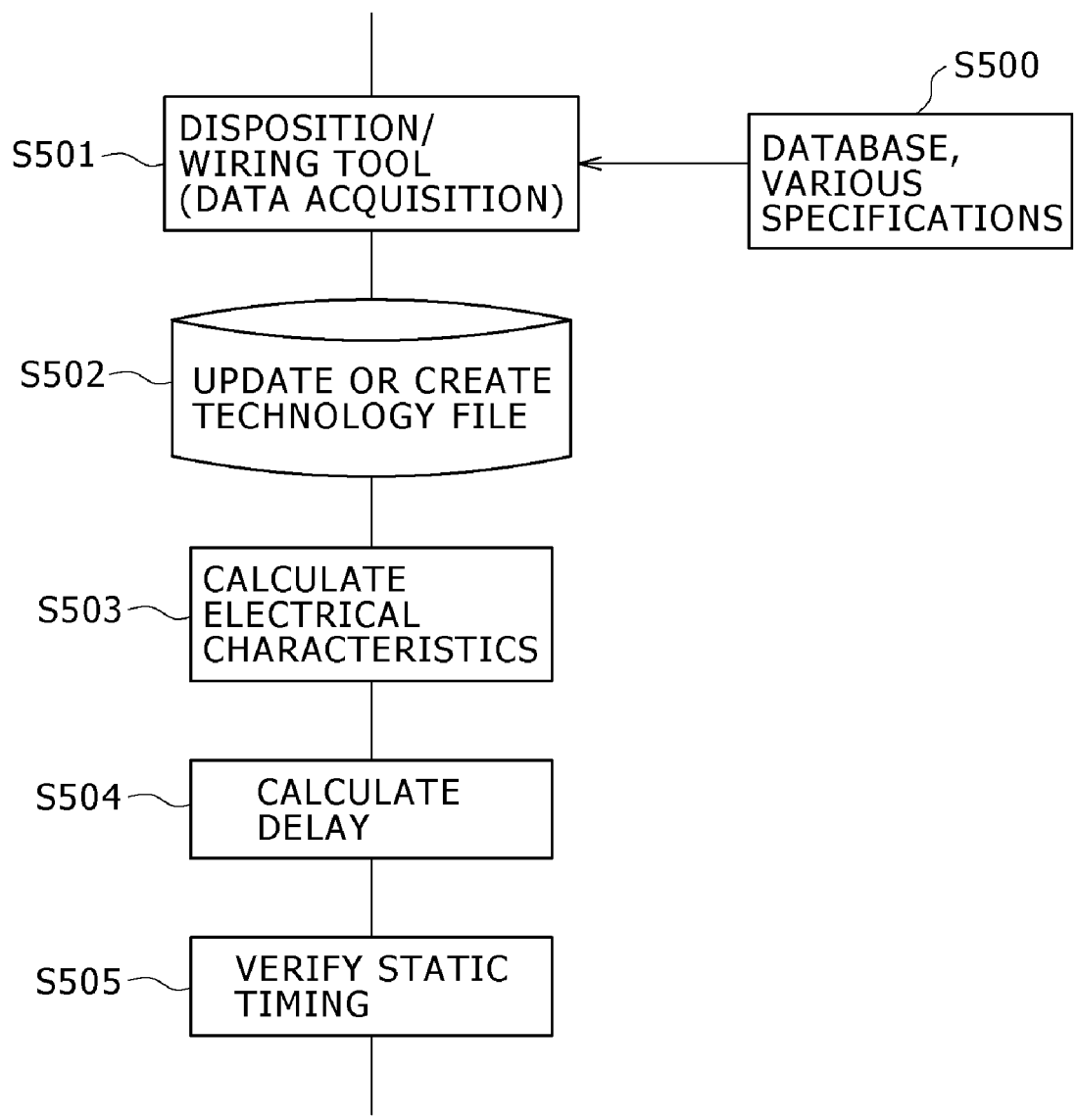
FIG. 5 is a flow chart (part 1) explaining a flow of a pattern designing method according to a second embodiment of the present invention.
Figure 6:
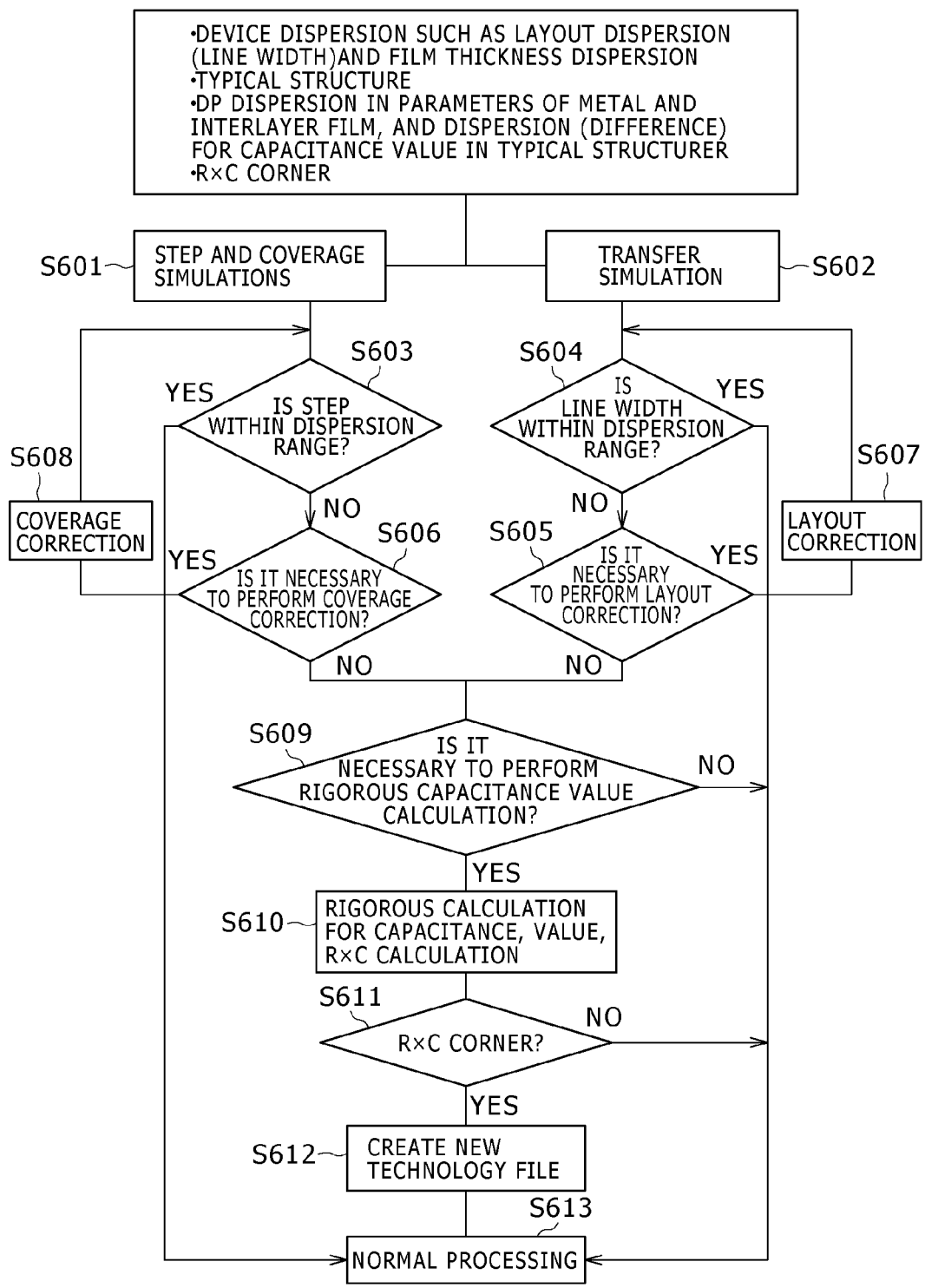
FIG. 6 is a flow chart (part 2) explaining a flow of the pattern designing method according to the second embodiment of the present invention.
Figure 7:
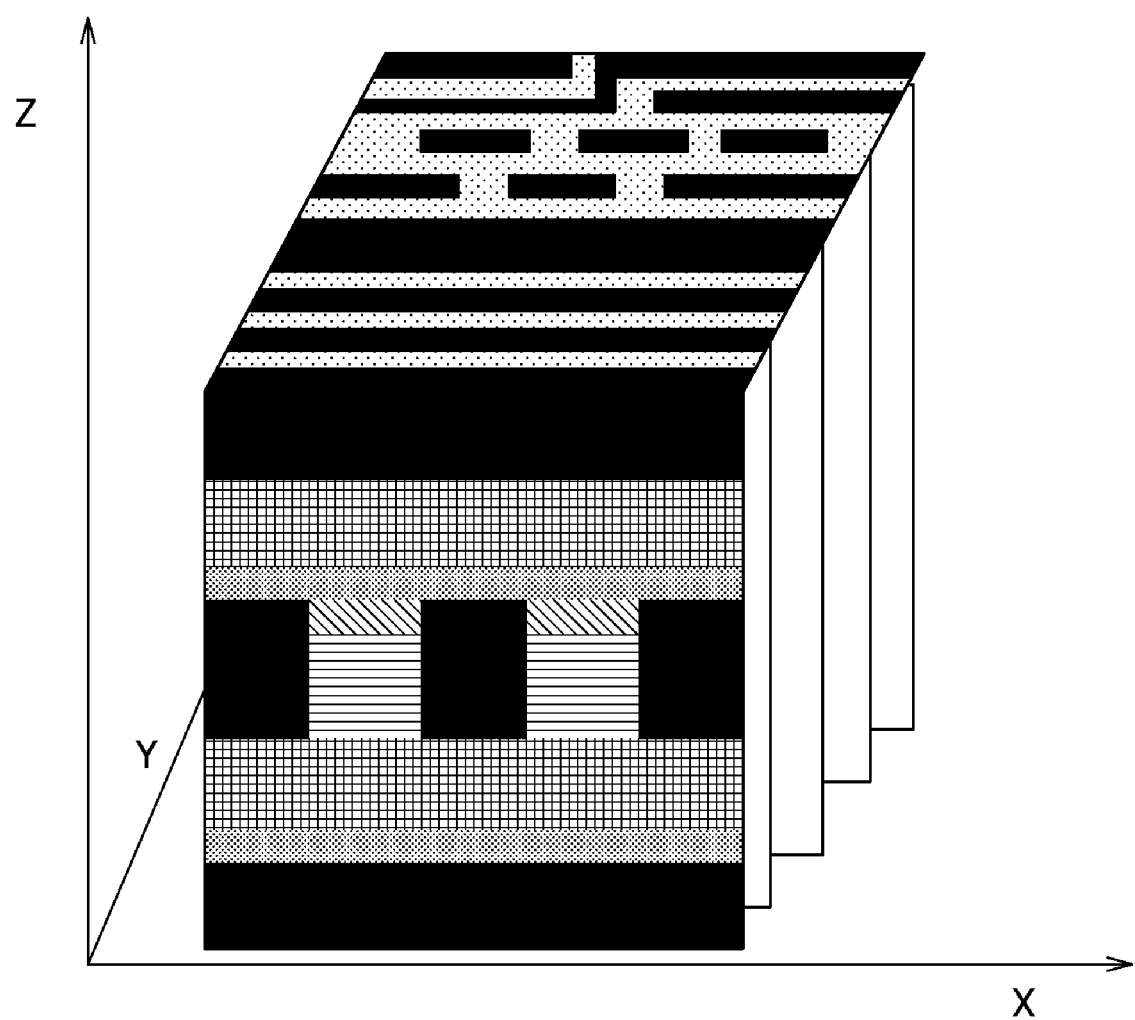
FIG. 7 is a schematic view explaining a layout structure of a device in the related art.

In a pattern designing method according to a second embodiment of the present invention, the processing of Steps in the described pattern designing method of the first embodiment is performed inside the disposition/wiring tool. FIGS. 5 and 6 show a flow of the pattern designing method according to the second embodiment of the present invention.

In Step S500 shown in FIG. 5, the various specifications are inputted to the disposition/wiring tool. The cell library, the technology file, the circuit connection information, and the like are normally inputted to the disposition/wiring tool. In addition thereto, the specifications about the dispersions in the line width and the thickness necessary for the shape screening, the typical cross-sectional structure of the device, the dispersion in the thickness of each of the layers, the difference for the capacitance value in the longitudinal structure of the typical device, and the like are also inputted to the disposition/wiring tool.

In the pattern designing method of this embodiment, an engine built in the disposition/wiring tool carries out the shape simulation for the physical layout produced by the disposition/wiring tool, and delivers the result of the shape simulation to the capacitance value extracting tool. That is to say, the transfer simulation and the step simulation from the physical layout previously described, the comparison of each of the simulations results with the corresponding one of the specifications, and the update or creation of the technology file corresponding to the comparison results are carried out (Step S502) after the data is acquired in the disposition/wiring tool (Step S501). Also, there are carried out the calculation for the electrical characteristics (Step S503), the delay calculation (Step S504), and the static timing verification (Step S505).

Specifically, as shown in FIG. 6, step and coverage simulations (Step S601), and a transfer simulation (Step S602) are carried out based on the figure information on the physical layout obtained by the disposition/wiring tool, and the information on the dispersion in the layout in the x-y direction, and the thickness dispersion in the x-z direction.

In a word, in a shape simulator provided in the disposition/wiring tool for the cross sectional structure, a step and coverage simulator operates for the longitudinal structure in the layout, and a simulator for a transfer simulation operates for the layout.

Also, when it is judged in Steps S603 and S604 that the step and the line width fall within the respective dispersion ranges, the normal processing is performed (Step S613). On the other hand, when it is judged in Steps S603 and S604 that the step and the line width are beyond the respective dispersion ranges, it is judged whether or not it is necessary to carry out the layout correction (Step S605), and it is judged whether or not it is necessary to carry out the coverage correction (Step S606). Here, these judgments are made based on the previously given line width dispersion, and the previously given step dispersion, respectively. When it is judged in Steps S605 and S606 that it is necessary to carry out the layout correction and the coverage correction, the layout correction and the coverage correction are carried out (Steps S607 and S608).

Also, it is judged again whether or not the step and the line width fall within the respective dispersion ranges for the layout thus changed (Steps S603 and S604). On the other hand, when it is judged in Steps S605 and S606 that it is unnecessary to carry out the layout correction and the coverage correction, it is judged based on the previously given specification whether or not it is necessary to carry out rigorous calculation (Step S609). When it is judged in Step S609 that it is unnecessary to carry out the rigorous calculation, the normal processing is executed (Step S613). On the other hand, when it is judged in Step S609 that it is necessary to carry out the rigorous calculation, the capacitance value is rigorously calculated, and moreover the product of the resistance value and the capacitance value is calculated based on the longitudinal structure of the device (Step S610).

It is judged in Step S611 whether or not the product of the resistance value and the capacitance value fulfills the specification about the previously given product of the capacitance value and the resistance value. When it is judged in Step S611 that the specification is fulfilled (No in Step S611), the normal processing is executed. On the other hand, when it is judged in Step S611 that the specification is not fulfilled (Yes in Step S611), a new technology file is created (Step S612), and is then delivered to the capacitance value extracting tool.

The specification about the product of the capacitance value and the resistance value is defined in the form of the difference for the product of the capacitance value and the resistance value in the typical longitudinal structure of the device. In this case, that difference is given in accordance with the timing constraint for the products. Although the processing result in this embodiment is equal to that (refer to FIG. 4) in the first embodiment (the impact to the delay is about 7, and the delay time is +121 ps), a period of time necessary for input/output of the data can be omitted because the disposition/wiring tool executes all the processing.

It is noted that the optical conditions for the shape simulation used in this embodiment are by no means limited to those described above, and thus can be changed in correspondence to the layout to be processed. In addition, those optical conditions can respond to the various conditions for a period of time from start-up time of products to maturation time of process conditions.

Moreover, when the processing of this embodiment is intended to be performed, an order of priority may be fixed to the processing in consideration of the electrical characteristics. That is to say, it is also possible that the transfer simulation is necessarily carried out for a portion corresponding to a critical path of a circuit, and the normal verification processing is executed for any other region other than a region corresponding to that portion.

In addition, if the verification for the line width and the step of the metal can be carried out, a verification using a method different from that for the transfer simulation and the step simulation as in this embodiment may also be carried out. In addition, the feedback of the result of the verification for the line width and the step varies depending on the extraction tools. Therefore, the specification about the technology file in this embodiment, and the technology file library shown in FIG. 3 varies depending on the tools used.

Effects of Embodiment

By using the pattern designing method of this embodiment, the dispersion in the layout of the device, and the dispersion in the cross-sectional structure are fed back to the technology file, thereby making it possible to enhance the precision necessary for the capacitance value extraction. In addition, the enhancement of the precision necessary for the capacitance value extraction results in that the corner of the capacitance value which has been excessively driven in a borderline state so far is relaxed, and thus the design margin necessary for the extraction decreases. As a result, it is possible to prevent the design margin from being dissipated.

Third Embodiment

A pattern designing method according to a third embodiment of the present invention aims at enhancing the precision necessary for an extraction method by combining a plurality of technology files each being created through the processing in the first or second embodiment.

With the general capacitance value extracting technique, the worst value and the best value are selected in a single uniform way with respect to the height, the width and the spacing of the wiring to be made the worst and best technology files, respectively. Also, the capacitance value extraction is carried out by using the two corners.

Here, the combination of the worst value and the best value as a result of changing the thicknesses of the metal and the interlayer films constituting the cross-sectional structure of the device in a single uniform way may be physically impossible. Therefore, it is thought to drive the corner in a borderline state too much.

Driving the corner in a borderline state too much leads to the dissipation of the design margin. Thus, when the corner becomes conservative, it becomes difficult to perform the design. However, the extraction using the conservative corner has been carried out due to fears of overlooking the worst value up to this day. For this reason, in such a high-advanced device as to have the gate length of 45 nm or less, the dissipation of the design margin owing to the overestimate of the corner has been hardly allowed.

Thus, in this embodiment, the corner of the technology file is more realistically defined, thereby enhancing the precision for the extraction. The method thereof is described as follows. That is to say, (1) the values of the thicknesses, the widths of the metal and the interlayer films, and the dispersion in the thicknesses and the widths thereof in the cross-sectional structure of the device, and in the arbitrary process conditions are prepared. (2) Next, the capacitance values when the thicknesses and the widths of the metal and the interlayer films are changed independently of each other so as to fall within the range of the dispersion described above are obtained (the capacitance values are set as $C_X$ (X=A, B, C, ...). On the other hand, the capacitance value (the capacitance value is designated by $C_{typical}$) in the typical (typical value) cross-sectional structure is also obtained. (3) A difference between $C_X$ and $C_{typical}$ obtained in (2) is obtained every parameter (A, B, C, ...) changed to extract the square root of a square of the difference. Also, the resulting square root of the square of the difference is made a difference corresponding to the corner of the capacitance value. The corner is obtained by adding the difference in capacitance value to the capacitance value in the typical cross-sectional structure. That is to say, when the thickness, the width and the like (parameters) to be changed, in the cross-sectional structure of the device, range from those each having a suffix A added thereto to those each having a suffix C added thereto, the following Expression (1) is obtained:

$$\text{Difference of corner of capacitance value} = \sqrt{((C_A - C_{typical})^2 + (C_B - C_{typical})^2 + (C_C - C_{typical})^2)} \quad (1)$$

where $C_A$, $C_B$ and $C_C$ represent the capacitance values when ones of the line width and the height of the metal, and the line widths and the heights of the interlayer films are changed, and $C_{typical}$ represents the capacitance value in the typical longitudinal structure. In this connection, when the parameters each having the large impact given to the delay can be previously specified, the difference described above may be calculated with an order of priority being fixed to the parameters based on the degree of the influence. On the other hand, when an order of priority is not especially fixed to the parameters, the difference in capacitance value when all the parameters are changed independently of one another may be calculated.

In this embodiment, the parameters each having the large impact given to the capacitance value are the line width of the metal, and the film thickness of the interlayer film A. For this reason, the capacitance value when the two parameters are changed within the range of the dispersion is calculated and is weighted with the degree of the influence exerted on the delay. Also, the capacitance value thus weighted is made the difference corresponding to the corner. The difference is expressed as follows by using Expression (1):

$$\text{Difference corresponding to corner of capacitance value} = \sqrt{(C1*(C_W - C_{typical})^2 + C2*(C_A - C_{typical})^2)} \quad (2)$$

Where $C_W$ represents the capacitance value calculated by using the structure in which the line width of the metal is changed up to the maximum value in the given specification, $C_A$ represents the capacitance value when the thickness of the interlayer film A is changed up to the maximum value within the range of the given specification.

C1 and C2 represent coefficients relating to the influence exerted on the delay. Here, in this embodiment, C1 and C2 were set as 0.75 and 0.25, respectively. A capacitance value obtained by adding the difference obtained from Expression (2) to the capacitance value in the typical longitudinal structure was registered as the corner of the capacitance value in the technology file for being extracted therefrom. As a result, it is found out that the impact to the delay is about 6, and the delay value is +93 ps. The result of the shape simulation is fed back to the technology file. Thus, the definition of the corner is changed, which results in that the precision of the extraction can be enhanced, and thus driving the margin in a borderline state too much so far can be relaxed.

It is noted that in this embodiment, the corner is set as the difference when the typical cross-sectional structure+the dispersion is reflected. The device dispersion may be used as that dispersion, or the value obtained from the result of the shape simulation used in the first and second embodiment may be used as that dispersion.

In addition, although in this embodiment, the line width of the metal and the film thickness of the interlayer film A are changed when the difference corresponding to the corner is obtained, the parameters to be changed are by no means limited to the two parameters. Since the value of the dispersion differs depending on the process conditions or the like for the products, the parameters each having the large impact to the capacitance value under the conditions at that time may be selected.

In addition, when the relative merits are hardly determined for the impacts given to the capacitance value, the line widths and the thicknesses of all the parameters (of the interlayer films and the metal) may be changed, thereby obtaining the difference corresponding to the corner of the capacitance value. In addition, the dispersion may be obtained in the form of the maximum value or the minimum value, or may be obtained in the form of the distribution.

On the other hand, in the case where the impacts to the capacitance value described above are equal to one another so that a plurality of candidates for the corner exist, the corner can be selected by using the concept of the probability. That is to say, the values of the total products of the probability densities of the film thicknesses of the interlayer films and the metal constituting the device, and the weights of the film thicknesses thereof are compared with one another, thereby making it possible to select the corner. Here, the following Expression (3) is obtained:

$$P_{total} = \Sigma C_i \times P_j \quad (3)$$

Where $P_{total}$ represents the probability of occurrence, $C_i$ represents the weight based on the sensitivity to corresponding one of the capacitance values of the interlayer films and the metal, and $P_j$ represents the probability density for corresponding one of the thicknesses of the interlayer films and the metal.

In this embodiment, four device cross-sectional structures existed as the corner candidates. Then, the calculation for the probability, $P_{total}$, of occurrence for the four structures based on Expression (3) shows a result shown in TABLE 1. From TABLE 1, the structure A, having the highest probability of occurrence, of the four candidate structures A to C was selected as the corner.

TABLE 1

|   | Best probability | Worst probability | P total [ppb] |
| --- | --- | --- | --- |
| A | 1.631E−05 | 9.571E−06 | 0.0677 |
| B | 4.371E−07 | 3.294E−07 | 1.440E−04 |
| C | 1.065E−10 | 1.065E−10 | 2.725E−11 |
| D | 8.638E−09 | 8.638E−09 | 7.461E−08 |

Best probability and worst probability in TABLE 1 represent the probability of occurrence of the best corner, and the probability of occurrence of the worst corner, respectively. Also, $P_{total}$ represents the products of the probability of occurrence of the best corner, and the probability of occurrence of the worst corner.

On the other hand, although the probability of occurrence of the best corner, and the probability of occurrence of the worst corner are obtained from Expression (3), $C_i$ in Expression (3), that is, the weights based on the sensitivities to the capacitance values of the interlayer films and the metal are as shown in TABLE 2.

TABLE 2

| Sensitivity | Film 1 | Film 2 | Film 3 | Film 4 | Film 5 |
|---|---|---|---|---|---|
| Weight | 2.944 | 43.005 | 29.042 | 3.056 | 1.000 |

TABLE 2 shows the weights of the interlayer films and the metal when the number of parameters each having the large impact to the capacitance value is set as five (films 1 to 5) by way of experiment.

In addition, TABLE 3 shows each of components (a probability density, $P_j$, for each interlayer film) of the best probability and the worst probability of the structure A shown in TABLE 1.

TABLE 3

| | Film 1 | Film 2 | Film 3 | Film 4 | Film 5 | P | $P_{total}$ | P |
|---|---|---|---|---|---|---|---|---|
| Best | 0.001 | 0.482 | 0.001 | 0.014 | 0.014 | 1.631E−05 | 6.765E−11 | 0.068 |
| Worst | 0.001 | 0.433 | 0.001 | 0.005 | 0.005 | 4.148E−06 | | |

The structure A in TABLE 1 was decided as the device structure of the capacitance value corner by using the results described above. It is noted that the number of interlayer films, and the structures corresponding thereto when the probabilities described above are obtained are by no means limited to those in this embodiment. In addition, the expression of the probability, $P_{total}$, of occurrence of the corner is not limited to Expression (3) as long as the probability of occurrence of the corner for the device structure can be obtained from any other suitable expression.

Effects of Embodiment

According to the third embodiment of the present invention, the corner is defined more precisely, thereby making it possible to enhance the precision for the capacitance value extraction. In addition, such enhancement of the precision for the capacitance value extraction results in that the corner of the capacitance value which has been excessively driven in the borderline state so far is relaxed, and thus the design margin necessary for the extraction decreases. Consequently, the design margin can be prevented from being dissipated.

It is noted that the pattern designing method of the embodiments described above is mainly realized in the form of a pattern designing program which is executed by a computer such as a work station, and can be stored in a predetermined medium (such as a CD-ROM or a DVD-ROM) for distribution and can be delivered through a network. In addition, the pattern designing method can also be used in a pattern designing apparatus which can execute the pattern designing program described above.

It should be understood by those skilled in the art that various modifications, combinations, sub-combinations and alterations may occur depending on requirements and other factors insofar as they are within the scope of the appended claims or the equivalents thereof.

What is claimed is:

1. A pattern designing method, when executed, causes a processor to perform the steps of:
acquiring circuit design data, said circuit design data present, at least in part, in a technology file;
carrying out, via the processor, a transfer simulation calculation and a step simulation calculation by using physical layout data produced from the circuit design data;
comparing, via the processor, results of the transfer simulation calculation and the step simulation calculation with a preset standard;
carrying out, via the processor, calculation of electrical characteristics by using parameters obtained from the physical layout upon determining that the preset standard is fulfilled as a result of the comparison, and carrying out calculation of the electrical characteristics in which the result of the transfer simulation calculation and the step simulation calculation are reflected in the parameters upon determining that the preset standard is not fulfilled as a result of the comparison; and
updating, via the processor, the technology file in accordance with the comparison when the preset standard is not fulfilled, said updating occurring prior to the calculation for electrical characteristics.

2. The pattern designing method according to claim 1, wherein the preset standard contains a tolerance for a width and a tolerance for a step in a pattern of the physical layout after completion of transfer.

3. The pattern designing method according to claim 1, wherein the parameters used when the electrical characteristics are calculated contains a line width in a pattern of each of layers constituting the physical layout and an amount of dispersion in the line width, a thickness of an interlayer film of each of said layers and an amount of dispersion in the thickness, and a value of a permittivity and an amount of dispersion in the value of the permittivity.

4. A non-transitory computer readable medium having a pattern designing program stored thereon, the pattern designing method, when implemented by a processor, comprises:
acquiring circuit design data, said circuit design data present, at least in part, in a technology file;
carrying out transfer simulation calculation and a step simulation calculation by using physical layout data produced from the circuit design data;
comparing a results of the transfer simulation calculation and the step simulation calculation with a preset standard;
carrying out calculation of electrical characteristics by using parameters obtained from the physical layout upon determining that the preset standard is fulfilled as a result of the comparison, and carrying out calculation of the electrical characteristics in which the result of the transfer simulation calculation is reflected in the parameters upon determining that the preset standard is not fulfilled as a result of the comparison; and
updating the technology file in accordance with the comparison when the preset standard is not fulfilled, said updating occurring prior to the calculation for electrical characteristics.

5. A pattern designing apparatus, comprising:
means for acquiring circuit design data, said circuit design data present, at least in part in a technology file;
means for carrying out a transfer simulation calculation and a step simulation calculation by using physical layout data produced from the circuit design data, and comparing results of the transfer simulation calculation and the step simulation calculation with a preset standard;

means for (a) carrying out calculation of electrical characteristics by using parameters obtained from the physical layout upon determining that the preset standard is fulfilled as a result of the comparison, and (b) carrying out calculation of the electrical characteristics in which the result of the transfer simulation calculation are reflected in the parameters upon determining that the preset standard is not fulfilled, wherein,
the technology file is updated in accordance with the comparison when the preset standard is not fulfilled, said update occurring prior to the calculation for electrical characteristics.

6. A pattern designing apparatus, comprising:
a section configured to acquire circuit design data, said circuit design data present, at least in part, in a technology file;
a section configured to carry out a transfer simulation calculation and a step simulation calculation by using physical layout data produced from the circuit design data, and compare results of the transfer simulation calculation and the step simulation calculation with a preset standard; and
a section configured to (a) carry out calculation of electrical characteristics by using parameters obtained from the physical layout upon determining that the preset standard is fulfilled, and (b) carry out calculation of the electrical characteristics in which the result of the transfer simulation calculation is reflected in the parameters upon determining that the preset standard is not fulfilled, wherein,
the technology file is updated in accordance with the comparison when the preset standard is not fulfilled, said update occurring prior to the calculation for electrical characteristics.

* * * * *